United States Patent [19]

Campo et al.

[11] Patent Number: 4,817,115
[45] Date of Patent: Mar. 28, 1989

[54] ENCODING AND DECODING SYSTEM FOR ELECTRONIC DATA COMMUNICATION SYSTEM

[75] Inventors: James A. Campo, Brunswick; Jeffrey W. Sutherland, Tallmadge; Carl E. Krill, III, Akron, all of Ohio

[73] Assignee: Telxon Corporation, Akron, Ohio

[21] Appl. No.: 19,636

[22] Filed: Feb. 27, 1987

[51] Int. Cl.[4] .............................................. H03K 7/08
[52] U.S. Cl. ...................................... 375/22; 371/52; 375/37
[58] Field of Search ............... 371/52, 55, 70; 375/22, 375/37, 49; 340/870.42, 825.63; 329/106; 332/9 R; 360/43, 44

[56] References Cited

U.S. PATENT DOCUMENTS

| | | | |
|---|---|---|---|
| 3,439,327 | 4/1969 | Sourgens | 371/52 |
| 3,528,057 | 9/1970 | Van Duuren et al. | 371/52 |
| 4,001,728 | 1/1977 | Schneider | 332/1 |
| 4,066,841 | 1/1978 | Young | 375/49 |
| 4,282,601 | 8/1981 | Flora | 375/20 |
| 4,373,152 | 2/1983 | Jacobsthal | 340/347 DD |
| 4,408,189 | 10/1983 | Betts et al. | 340/347 DD |
| 4,419,757 | 12/1983 | De Gennaro et al. | 375/17 |
| 4,426,667 | 1/1984 | Masher et al. | 360/43 |
| 4,489,417 | 12/1984 | Askin et al. | 375/17 |
| 4,497,060 | 1/1985 | Yang | 375/22 |
| 4,567,601 | 1/1986 | Mountain | 375/22 |
| 4,599,723 | 7/1986 | Eck | 371/70 |

Primary Examiner—Benedict V. Safourek
Attorney, Agent, or Firm—Haight & Hofeldt

[57] ABSTRACT

An encoding and decoding system for electronic data communication system, wherein each character to be transmitted is encoded as a unique multi-bit binary value. The total number of bits as well as the number of logic one bits in all unique multi-bit binary values are the same. A pulse generating means generates a wide pulse for each logic one and a narrow pulse for each logic zero. The pulses which make up a unique pulse form for each data character to be transmitted are of alternating polarity and are transmitted as analog signals.

39 Claims, 5 Drawing Sheets

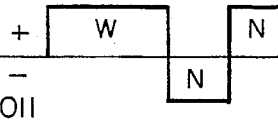
ARBITRARY CHAR. 1
HEX VALUE : 103
BINARY : 100000011
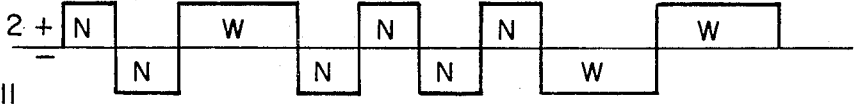
ARBITRARY CHAR 2
HEX VALUE : 043
BINARY : 001000011
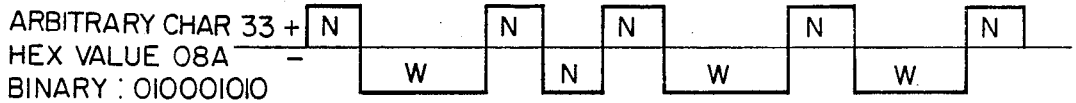
ARBITRARY CHAR 33
HEX VALUE 08A
BINARY : 010001010
START SYNC. (40 BCT)
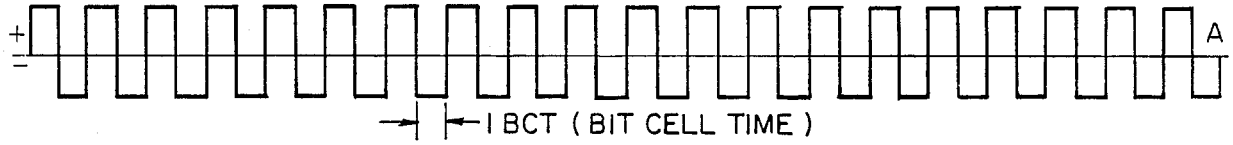
1 BCT (BIT CELL TIME)
2 BCT  CALIBRATION CHAR. (29 BCT)
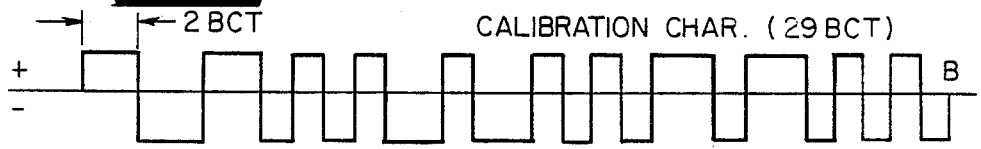
END SYNC: (17 BCT MIN, 23 BCT MAX)

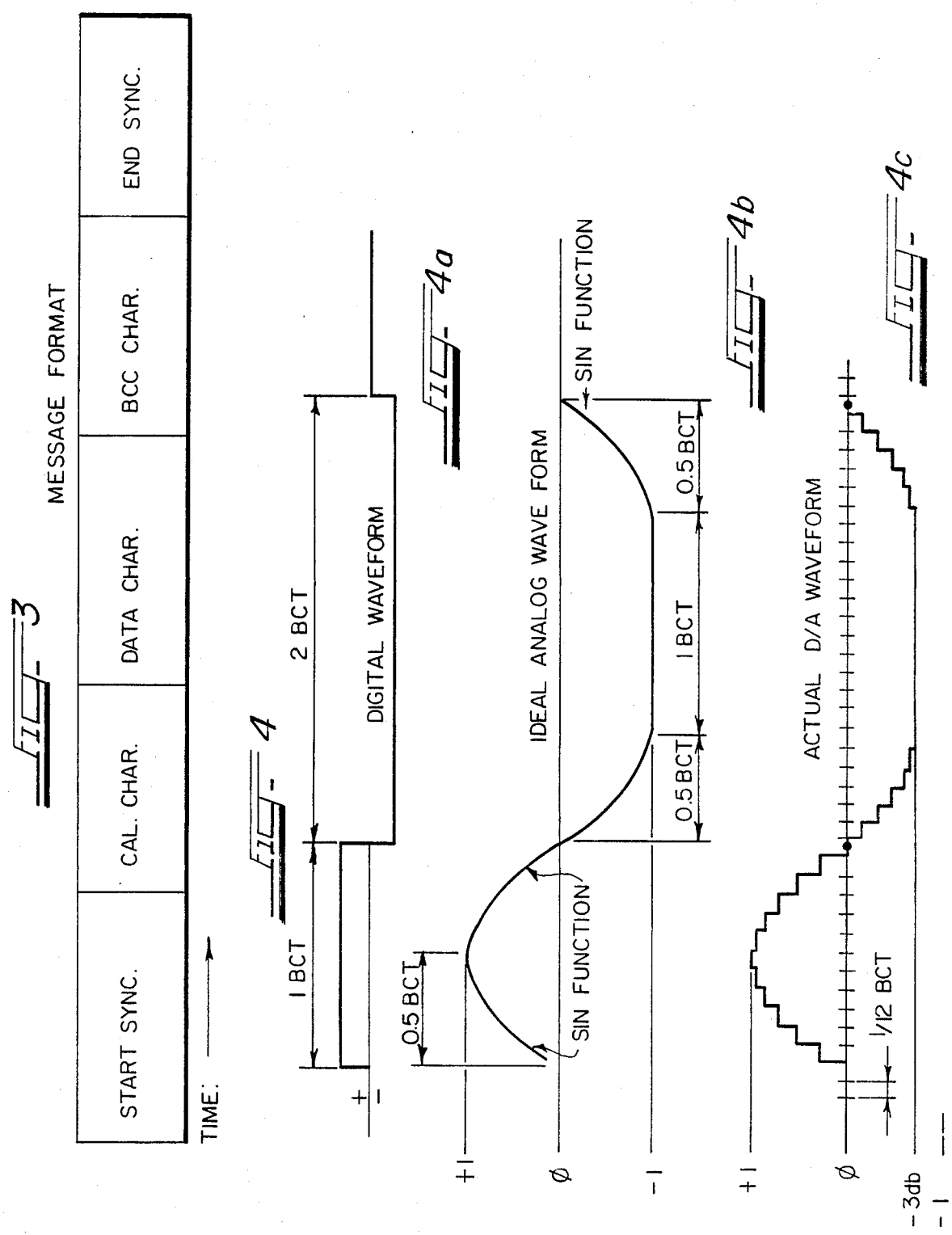

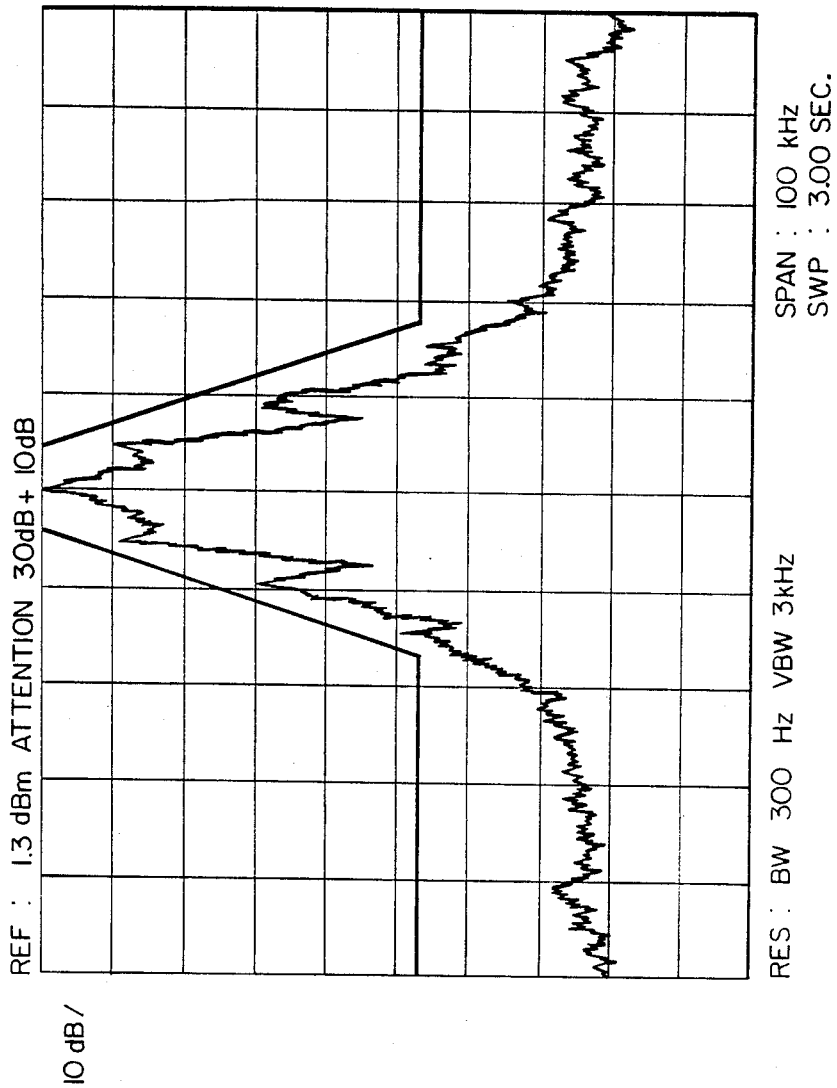

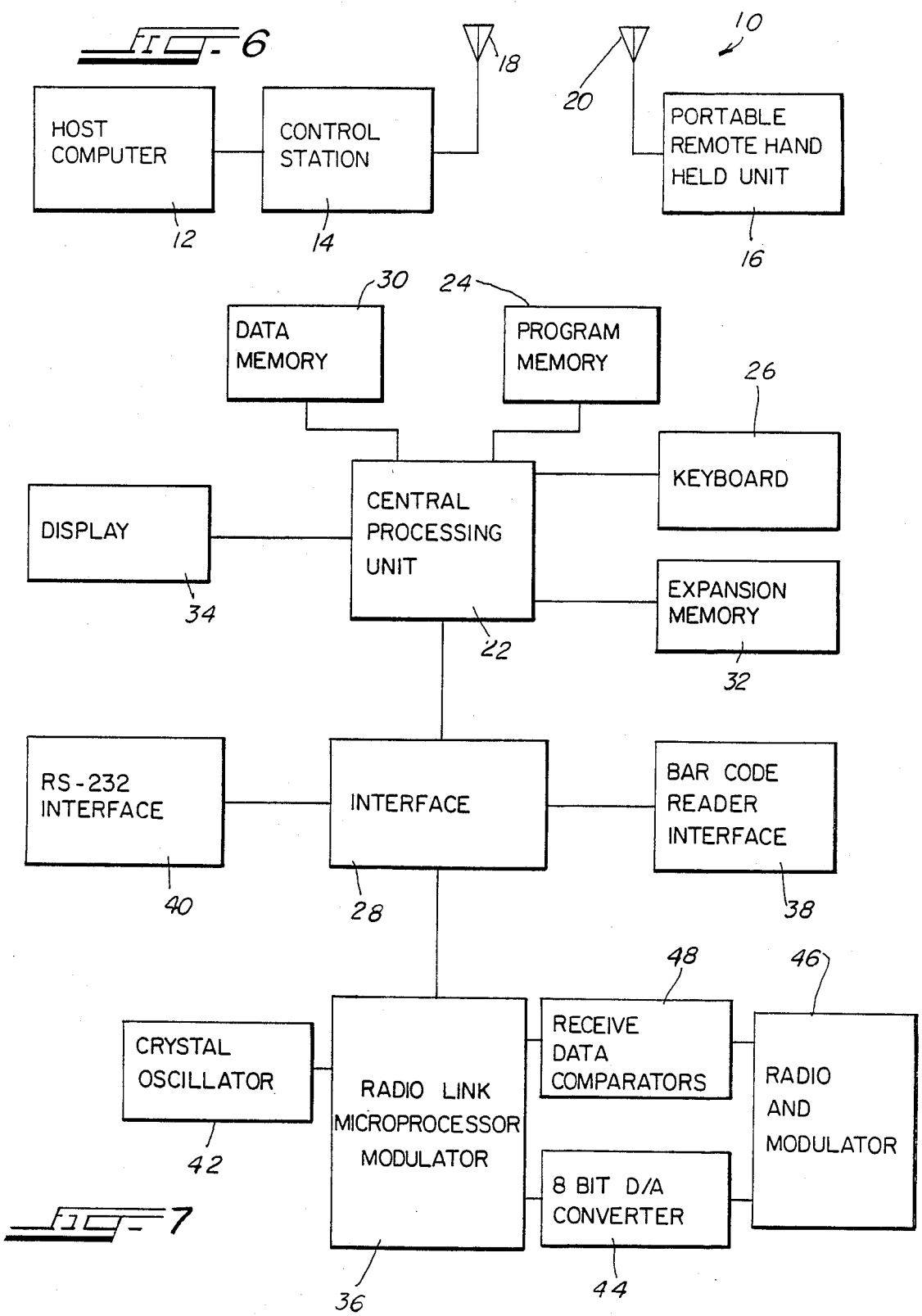

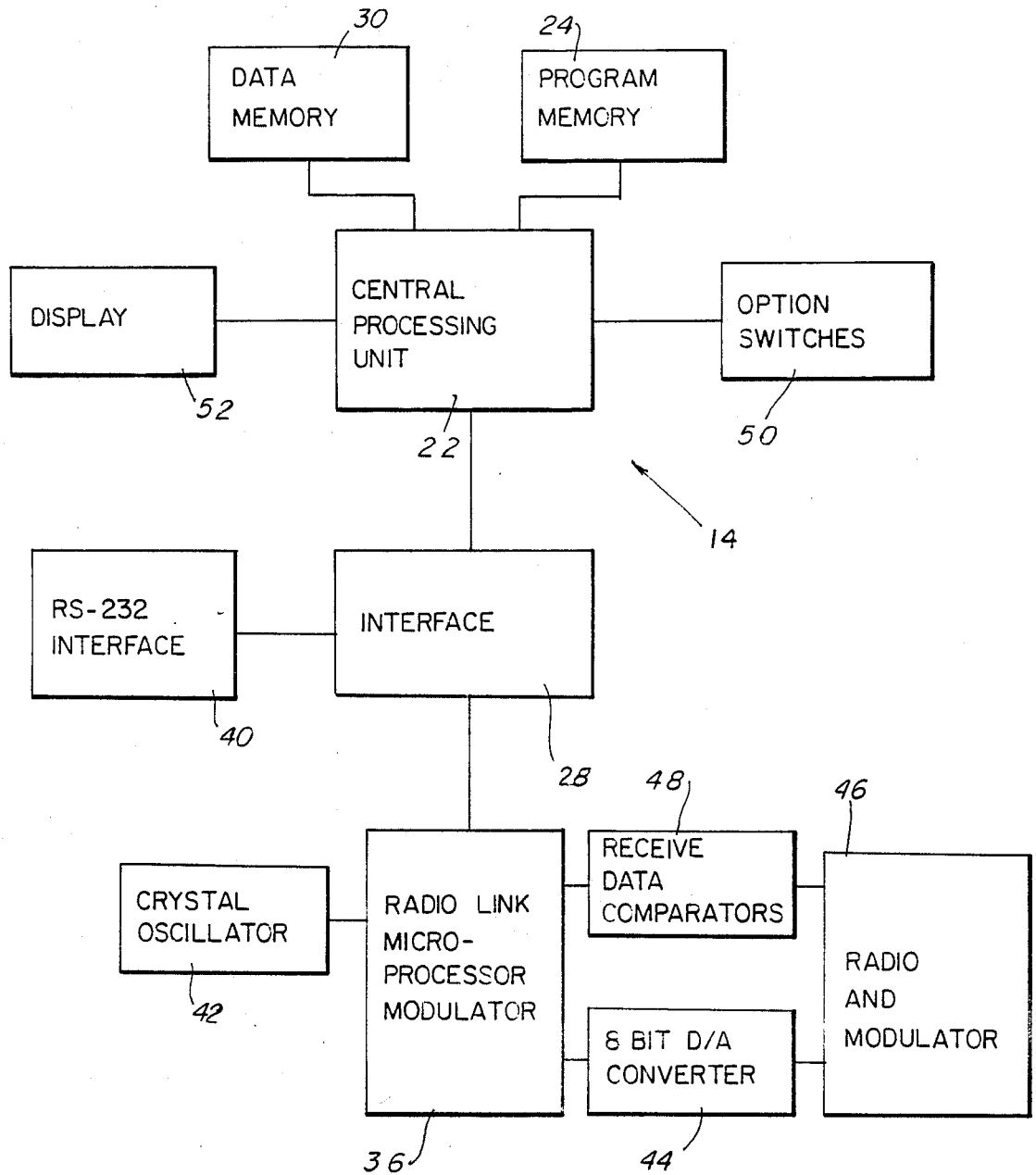

ENCODING AND DECODING SYSTEM FOR ELECTRONIC DATA COMMUNICATION SYSTEM

BACKGROUND OF THE INVENTION

This invention relates to an improved method and electronic communication system for encoding and decoding data and for generating and discriminating analog signals to be used by modulators and de-modulators for transmission over various types of communications media.

A multitude of schemes have been used to send and receive data between two or more devices over many different medias. A typical transaction involves the entry of data by way of a keyboard, wand, reader or other input device to a computer or microprocessor. The data is formatted by the microprocessor and then presented to a circuit that provides an electrical interface to devices that provide modulation or process the signal to be compatible with the media used. The data is generally presented to a serial asynchronous or synchronous receiver/transmitter chip referred to as a UART or USART, followed by filters and other analog circuits that condition the signal for input to a modulator. There are many types of modulation schemes used to transmit the data, such as amplitude (AM), frequency (FM or FSK), phase (PM or PSK), pulse (PCM), and many variations and combinations of these. The modulation scheme is selected for the system requirements and media used, such as radio transmission, telephone lines, fiber optics, dedicated wires, infra-red and others.

The receiver demodulates the transmitted signal into an analog signal that is processed by interface circuits into a serial digital signal. The digital signal is presented to a UART or USART receiver resulting in digital data that is formatted by a microprocessor into an output understandable by an operator.

When evaluating the performance of a data communication system, factors to be considered are speed, data integrity, error rate, number of re-transmissions for a successful message, range, signal to noise ratios, distortion rejection, calibration, maintenance of complex hardware, cost, allowable system band width, and privacy or security. All of these factors, and even more, are inherent in any data communications system, without regard to the scheme used to encode and decode, and modulate and demodulate the data to be transmitted by the communications system.

SUMMARY OF THE PRESENT INVENTION

Taking into consideration the above-mentioned factors and other characteristics of data communication systems, in accordance with the present invention an improved method of encoding and decoding data and in generating and discriminating an analog signal that can be used by many different modulators and demodulators on many different media is provided.

The improved means and method for transmitting and receiving data of the present invention is based upon what will hereinafter be called an adaptive pulse width modem. The adaptive pulse width modem hardware is controlled by a microprocessor and associated software. The software is modularized to provide programs to control the following major functions:
1. Communications to a master data computer.
2. Transmission of data.
3. Reception of data.
4. Diagnostics Under control of the software, the adaptive pulse width modem hardware performs the following specific tasks:
1. Receives commands and data from a master data computer.
2. Encodes a character set such as the standard ASCII characters in data blocks to a binary bit pattern.
3. Converts the binary bit pattern to an analog signal useful for radio modulation.
4. Supports programmable baud rates in access of 9600 bps.
5. Provides radio power and transmit/receive mode control.
6. Monitors power supply conditions.
7. Amplifies an analog signal produced by the radio receiver and converts it to a digital signal form.
8. Decodes digital signals into character sets such as ASCII characters.
9. Sends commands, error reports and data to the master data computer.
10. Incorporates off-line diagnostic and calibration functions.

The modem hardware and software provides a link transport protocol which can distinguish wide band noise from data in the receive mode, defines both the start and the end of a data block independently of a full character set, such as all 128 standard ASCII characters, remains transparent to all characters within a data block, checks each character within a data block for integrity, guarantees data block integrity with a BCC (Block Character Check), dynamically adapts to link distortion, incorporates timeout/fault exits, and generates run time error codes.

DESCRIPTION OF THE DRAWINGS

FIGS. 1A, B, and C represents pulse trains for three arbitrary characters as are transmitted between a control station and a portable remote hand held unit in accordance with the present invention in the electronic data communication system, as shown in FIGS. 6 through 9.

FIGS. 2A, B, and C illustrate the digital waveforms of the START SYNC, CALIBRATION CHARACTERS, and END SYNC patterns, respectively, of the electronic data communication system of the present invention, as shown in FIGS. 6 through 9.

FIG. 3 illustrates the transmitted message format sequence of the electronic data communication system of the present invention.

FIGS. 4A, B, and C illustrate the transformation of a digital waveform into an actual analog signal generated by the D/A converter of the electronic data communication system of the present invention.

FIG. 5 is a graph of the bandwidth occupied while transmitting in random order all 84 binary values which are available with a 9 bit binary value at 9600 bps.

FIG. 6 is a block diagram of the principal components of the electronic data communication system of the present invention.

FIG. 7 is a more detailed block diagram of the portable remote hand held unit portion of the electronic data communication system of present invention.

FIG. 8 is a more detailed block diagram of the control station of the electronic data communication system of the present invention.

DETAILED DESCRIPTION OF THE PREFERRED EMBODIMENT

In accordance with the preferred embodiment of this invention, an adaptive pulse width modem is provided, which under the control of software, encodes ASCII characters into a 9 bit binary pattern of logic 1 and logic 0 states. A logic 1 state in a given bit position indicates a wide pulse is to be transmitted and a logic 0 state in a given bit position indicates a narrow pulse is to be transmitted. Each encoded character consists of an odd number of bits (9), with the pattern transmitted for each character always starting with a positive polarity pulse and always ending with a positive polarity pulse. Ideally, the sum of all logic 1 and all logic 0 positive pulse widths for a given character should equal the sum of all logic 1 and all logic 0 negative pulse widths for that character, so as to minimize voltage bias shifting from character to character as a data block is transmitted. This requirement is taken into account by the encoding scheme of this invention. The combination of pulse widths and relative positions of the pulses within the 9 bit pattern is such that the receiver decoding process is self-checking on an individual character basis. Further, a pulse width ratio of 2 to 1 is utilized and the number of unique character combinations is established to minimize the bandwidth required to transmit data at high bit rates.

In accordance with these criteria, the ASCII characters are encoded by the adaptive pulse width modem of this invention, such that each character contains nine bits, three logic 1 (wide) pulses and six logic 0 (narrow) pulses. The number of possible combinations of unique characters using this encoding method is 84. Since the standard ASCII character set contains 128 characters, two 84 character tables are established by the software. One character in each table is used to shift between the tables, thereby yielding 166 unique, usable characters, while only 84 unique combinations are actually transmitted. While it is possible that more than two tables could be maintained, the multiple shift characters that would be required to move between the multiple character tables would increase overhead on the RF link and thereby reduce data throughput.

The hex equivalents of the 84 character combinations are set forth in the following Table I:

TABLE I

AMPLITUDE PULSE WIDTH MODULATION CHARACTER SET

| ARBITRARY CHARACTER | HEX VALUE | BINARY VALUE | BINARY PULSE FORM |
|---|---|---|---|
| 1 | 103 | 1 0000 0011 | W,N,N,N,N,N,N,W,W |
| 2 | 043 | 0 0100 0011 | N,W,N,N,N,N,N,W,W |
| 3 | 142 | 1 0100 0010 | W,N,W,N,N,N,N,W,N |
| 4 | 013 | 0 0001 0011 | N,N,N,N,W,N,N,W,W |
| 5 | 112 | 1 0001 0010 | W,N,N,N,W,N,N,W,N |
| 6 | 052 | 0 0101 0010 | N,N,W,N,W,N,N,W,N |
| 7 | 007 | 0 0000 0111 | N,N,N,N,N,W,W,W |
| 8 | 106 | 1 0000 0110 | W,N,N,N,N,N,W,W,N |
| 9 | 046 | 0 0100 0110 | N,W,N,N,N,N,W,W,N |
| 10 | 016 | 0 0001 0110 | N,N,N,N,W,N,W,W,N |
| 11 | 0A8 | 0 1010 1000 | N,W,N,W,N,W,N,N,N |
| 12 | 109 | 1 0000 1001 | W,N,N,N,N,W,N,N,W |
| 13 | 049 | 0 0100 1001 | N,W,N,N,N,W,N,N,W |
| 14 | 148 | 1 0100 1000 | W,N,W,N,N,W,N,N,N |
| 15 | 019 | 0 0001 1001 | N,N,N,N,W,W,N,N,W |
| 16 | 118 | 1 0001 1000 | W,N,N,N,W,W,N,N,N |
| 17 | 058 | 0 0101 1000 | N,N,W,N,W,W,N,N,N |
| 18 | 00D | 0 0000 1101 | N,N,N,N,W,W,N,W |
| 19 | 10C | 1 0000 1100 | W,N,N,N,N,W,W,N,N |
| 20 | 04C | 0 0100 1100 | N,W,N,N,N,W,W,N,N |
| 21 | 01C | 0 0001 1100 | N,N,N,N,W,W,W,N,N |
| 22 | 0A2 | 0 1010 0010 | N,W,N,W,N,N,N,W,N |
| 23 | 121 | 1 0010 0001 | W,N,N,W,N,N,N,N,W |
| 24 | 061 | 0 0110 0001 | N,N,W,W,N,N,N,N,W |
| 25 | 160 | 1 0110 0000 | W,N,W,W,N,N,N,N,N |
| 26 | 031 | 0 0011 0001 | N,N,N,W,W,N,N,N,W |
| 27 | 130 | 1 0011 0000 | W,N,N,W,W,N,N,N,N |
| 28 | 070 | 0 0111 0000 | N,N,W,W,W,N,N,N,N |
| 29 | 025 | 0 0010 0101 | N,N,N,W,N,N,W,N,W |
| 30 | 124 | 1 0010 0100 | W,N,N,W,N,N,W,N,N |
| 31 | 064 | 0 0110 0100 | N,N,W,W,N,N,W,N,N |
| 32 | 034 | 0 0011 0100 | N,N,N,W,W,N,W,N,N |
| 33 | 08A | 0 1000 1010 | N,W,N,N,N,W,N,W,N |
| 34 | 181 | 1 1000 0001 | W,W,N,N,N,N,N,N,W |
| 35 | 0C1 | 0 1100 0001 | N,W,W,N,N,N,N,N,W |
| 36 | 1C0 | 1 1100 0000 | W,W,W,N,N,N,N,N,N |
| 37 | 091 | 0 1001 0001 | N,W,N,N,W,N,N,N,W |
| 38 | 190 | 1 1001 0000 | W,W,N,N,W,N,N,N,N |
| 39 | 0D0 | 0 1101 0000 | N,W,W,N,W,N,N,N,N |
| 40 | 085 | 0 1000 0101 | N,W,N,N,N,N,W,N,W |
| 41 | 184 | 1 1000 0100 | W,W,N,N,N,N,W,N,N |
| 42 | 0C4 | 0 1100 0100 | N,W,W,N,N,N,W,N,N |
| 43 | 094 | 0 1001 0100 | N,W,N,N,W,N,W,N,N |
| 44 | 02A | 0 0010 1010 | N,N,N,W,N,W,N,W,N |
| 45 | 0A1 | 0 1010 0001 | N,W,N,W,N,N,N,N,W |
| 46 | 089 | 0 1000 1001 | N,W,N,N,N,W,N,N,W |
| 47 | 083 | 0 1000 0011 | N,W,N,N,N,N,N,W,W |
| 48 | 029 | 0 0010 1001 | N,N,N,W,N,W,N,N,W |
| 49 | 023 | 0 0010 0011 | N,N,N,W,N,N,N,W,W |
| 50 | 00B | 0 0000 1011 | N,N,N,N,N,W,N,W,W |
| 51 | 0A4 | 0 1010 0100 | N,W,N,W,N,N,W,N,N |
| 52 | 08C | 0 1000 1100 | N,W,N,N,N,W,W,N,N |
| 53 | 086 | 0 1000 0110 | N,W,N,N,N,N,W,W,N |
| 54 | 02C | 0 0010 1100 | N,N,N,W,N,W,W,N,N |
| 55 | 026 | 0 0010 0110 | N,N,N,W,N,N,W,W,N |
| 56 | 00E | 0 0000 1110 | N,N,N,N,N,W,W,W,N |
| 57 | 0B0 | 0 1011 0000 | N,W,N,W,W,N,N,N,N |
| 58 | 098 | 0 1001 1000 | N,W,N,N,W,W,N,N,N |
| 59 | 092 | 0 1001 0010 | N,W,N,N,W,N,N,W,N |
| 60 | 038 | 0 0011 1000 | N,N,N,W,W,W,N,N,N |
| 61 | 032 | 0 0011 0010 | N,N,N,W,W,N,N,W,N |
| 62 | 01A | 0 0001 1010 | N,N,N,N,W,W,N,W,N |
| 63 | 0E0 | 0 1110 0000 | N,W,W,W,N,N,N,N,N |
| 64 | 0C8 | 0 1100 1000 | N,W,W,N,N,W,N,N,N |
| 65 | 0C2 | 0 1100 0010 | N,W,W,N,N,N,N,W,N |
| 66 | 068 | 0 0110 1000 | N,N,W,W,N,W,N,N,N |
| 67 | 062 | 0 0110 0010 | N,N,W,W,N,N,N,W,N |
| 68 | 04A | 0 0100 1010 | N,W,N,N,N,W,N,W,N |
| 69 | 1A0 | 1 1010 0000 | W,W,N,W,N,N,N,N,N |
| 70 | 188 | 1 1000 1000 | W,W,N,N,N,W,N,N,N |
| 71 | 182 | 1 1000 0010 | W,W,N,N,N,N,N,W,N |
| 72 | 128 | 1 0010 1000 | W,N,N,W,N,W,N,N,N |
| 73 | 122 | 1 0010 0010 | W,N,N,W,N,N,N,W,N |
| 74 | 10A | 1 0000 1010 | W,N,N,N,N,W,N,W,N |
| 75 | 141 | 1 0100 0001 | W,N,W,N,N,N,N,N,W |
| 76 | 144 | 1 0100 0100 | W,N,W,N,N,N,W,N,N |
| 77 | 150 | 1 0101 0000 | W,N,W,N,W,N,N,N,N |
| 78 | 114 | 1 0001 0100 | W,N,N,N,W,N,W,N,N |
| 79 | 111 | 1 0001 0001 | W,N,N,N,W,N,N,N,W |
| 80 | 105 | 1 0000 0101 | W,N,N,N,N,N,W,N,W |
| 81 | 054 | 0 0101 0100 | N,N,W,N,W,N,W,N,N |
| 82 | 045 | 0 0100 0101 | N,W,N,N,N,N,W,N,W |
| 83 | 051 | 0 0101 0001 | N,N,W,N,W,N,N,N,W |
| 84 | 015 | 0 0001 0101 | N,N,N,N,W,N,W,N,W |

Referring to TABLE I, the numerals 1 through 84 in the first column entitled, "ARBITRARY CHARACTER", are representative of the 84 unique characters to which any arbitrary ASCII character can be assigned. For instance, the arbitrary characters 1 through 26 could represent the lower case letters "a" through "z" and the numerals 27–52 represent the upper case letters "A" through "Z". The remaining arbitrary characters would be assigned to the remaining characters of the standard ASCII character set. One of the arbitrary positions must be reserved to produce the indication to the system to shift to the second table of 84 unique characters. The second table also contains a shift character to instruct the system to go back to the first table. As previously set forth, this results in 83 unique characters that are assigned in each table, for a total of 166. The second column entitled, HEX VALUE is a 3 digit hex number representing the 9 bit binary pattern that is transmitted for each arbitrary character. The third column sets forth the BINARY VALUE representation of the pulse widths to be transmitted. A logic 1 indicating a wide pulse and a logic 0 indicating a narrow pulse. Thus, in the column of the table entitled PULSE FORM, a W indicates a wide pulse and a N indicates a narrow pulse. Each logic 1 in the BINARY VALUE column is replaced by a W in the pulse form column and each logic 0 in the BINARY VALUE column is replaced by an N in the pulse form column.

Referring to FIG. 1, the digital representation of the pulse trains for three arbitrary characters are shown. FIG. 1A shows the pulse train which represents the arbitrary character 1 in TABLE I, which has the hex value 103 and the binary value 100000011. The pulse train begins with a wide positive pulse representative of the first logic 1, followed by six alternating negative and positive narrow pulses representing the six logic 0's, followed by negative and positive wide pulses representing the two logic 1's. Similarly, FIG. 1B shows the pulse train which represents the arbitrary character 2 in TABLE I, which has the hex value 043 and the binary value 001000011. Finally, FIG. 1C shows the pulse train which represents the arbitrary character 33 in TABLE I, which has the hex value 08A and the binary value 010001010. It should be noted that each pulse train begins and ends with a positive pulse, and as previously set forth, each has three wide pulses and 6 narrow pulses. The electronic data communication system inserts a narrow negative pulse between successive characters as they are transmitted.

Since the adaptive pulse width modem of this invention is software controlled, any ASCII character can be assigned to any one of the 84 character combinations. This will allow custom character assignments for any given pair or system of modems. This feature of the system readily provides for data privacy.

To provide a communication system that can transmit and receive all ASCII characters and yet be totally transparent to them requires the definition of special control characters or patterns that the electronic data communication system under software control can recognize. In the case of an RF system application, channel noise in the absence of a carrier is of a quite high frequency and is limited by the receiver bandwidth. When data is transmitted at bit rates approaching th receiver bandwidth, data and wide band noise appear to be quite similar.

To distinguish wide band noise from data and to define the start and stop of each data block, a sync pattern is provided. The sync pattern is a 50% duty cycle pattern of narrow pulse widths. The sync duration at the beginning of a message, START SYNC as shown in FIG. 2A, is longer than the sync duration at the end of the message, END SYNC as shown in FIG. 2C. END SYNC also contains two trailing wide pulses, which further distinguish END SYNC from START SYNC. Thus, quick detection of the start or the end of a message, which is particularly useful in contention mode systems, is provided. False sync detection of wide band noise is practically eliminated by validating consecutive period measurements of the sync pattern. A minimum number of valid consecutive measurements indicates the presence of data. There is a relationship between the number of valid sync periods measured and the ability to reject wide band noise. The more consecutive valid measurements made, the less chance there is to falsely sync on noise. Since a large number of sync periods will decrease real data throughput on a system, a tradeoff of how many sync periods to use verses the allowable false sync detection rate must be made. In the RF system of the preferred embodiment of this invention forty sync bits are used. The number of sync bits is software controlled, such that it may easily be changed.

In any communication system, signal distortion will inhibit successful data transmission. Since the information in the data transmission is contained in a pattern of pulse widths, the decoding process should be as fault tolerant of pulse width distortion as possible. Most decoding schemes compare pulse widths against fixed absolute values. The scheme provided by this invention measures the actual pulse widths of known calibration characters transmitted at the beginning of the message and calculates a set point value against which the following pulse widths are compared. The measurement of the calibration characters allows the system to adapt to transmitter, media, and receiver distortion. Hence, the name adaptive pulse width modem is used in the description of this invention.

In the preferred embodiment of this invention, two calibration characters, as shown in FIG. 2B, are selected to represent the typical profile of a radio receiver electronic distortion. Based on the calibration character measurements, two set points, one for positive polarity and one for negative polarity pulses, are dynamically determined from the following four measured conditions:
1. Maximum width of a narrow negative pulse;
2. Minimum width of wide negative pulse;
3. Maximum width of a narrow positive pulse;
4. Minimum width of a wide positive pulse.

Error checks are made to verify that a maximum width narrow pulse is not wider than a minimum width wide pulse of the same polarity. Two set points are required because in the decoding of characters, the widths of only like polarity pulses are compared. This adaptive width and selective comparison decoding scheme results in a system tolerance to adjacent positive/negative pulse bias distortion and adjacent pulse crosstalk distortion.

Several other security checks are done in the decoding of each character. A tolerance check is made on the sum of all pulse widths within a character and a check for six narrow and three wide pulses within a character is also made. The decoding scheme also checks for alternate adjacent pulse polarities and therefore quickly detects noise hits. This decoding process results in an excellent security check on a character, and is far superior to the common parity bit checks that are currently in use.

The electronic data communication system of this invention provides total message integrity, by attaching to the end of a transmitted message a BCC (block character check) which is checked by the receiver. The block character check which is transmitted as wide and narrow pulses represents a checksum which is derived from and is representative of all of the data characters transmitted in one message. The receiving unit generates another block character check formed of wide and narrow pulses which represents a checksum derived from and representative of all of the data characters received by the receiver. The checksum transmitted to the receiver is compared with that generated by the receiver so as to determine the integrity of the data transmission.

FIG. 3 illustrates the actual message format and the sequence of sync, calibration characters, data, and BCC.

The pulse width transmission system of this invention through the use of character encoding, sync patterns, and arbitrary ASCII character assignment to encoded bit patterns provides data security. Standard commercial receiver equipment cannot receive the transmissions of this invention and provide an understandable data output to the operator of the receiver equipment. While specialized equipment, such as digital storage devices, and deliberate efforts to decipher the code might result in the recovery of understandable data, this would require the expertise of a technical expert and could not be accomplished by the average lay person.

In the preferred embodiment of this invention, the adaptive pulse width modem is designed to be used with a radio that allows a direct modulation input to the transmitter final output stage. In this arrangement, the microphone limiter circuit is bypassed to allow data transfer at a faster bit rate and with lower distortion. In this arrangement, typical bit rates are 4800 to 9600 bps. Because of bandwidth limitations of typical radio receivers, the amplitude of narrow pulses tend to be attenuated when compared to wide pulses. Since the amplitudes of the D/A converter is controllable by software, the amplitude of the wide pulses are pre-compensated prior to transmission a shown in FIG. 3C. This results in the reception of normalized pulse amplitudes at the receiver and further enhances the decoding of characters.

Since performance of an electronic data communication system is relative, a general reference will be established. With the data communications system of this invention utilizing the adaptive pulse width modem as previously set forth under actual operating conditions at 9600 bps on a radio link, a 95% error free message rate was achieved with a signal to noise ratio at the radio receiver of 14 db SINAD. The occupied bandwidth while transmitting at 9600 bps a message containing the full ASCII character set is shown in FIG. 4.

A standard for mobile digital equipment proposed by the National Institute of Justice requires at least a 75% error free transmission rate with 18 db receiver SINAD level. Many RF systems of reasonable quality which are now commercially available will only meet this standard at 4800 bps or less.

Referring to FIG. 6, an electronic data communication system 10 comprises a host computer 12, a control station 14, and a portable remote hand held unit 16 linked by a RF communication represented by the antenna 18 and 20, which utilizes the preferred encoding and decoding system of this invention as shown. In a typical application of the encoding and decoding system of this invention, the input to the portable remote hand held unit 16 may be data generated by a bar code reader or data entered on a keyboard, which data is then transmitted through the RF link between the antennas 18 and 20 to the control station 14 wherein the data is converted into signals usable by the host computer 12.

The more detailed block diagram of FIG. 7 shows the principal components of the portable remote hand held unit 16. The portable remote hand held unit includes a central processing unit 22 which performs the function of processing and manipulating data received from various elements of the system, and then provides the manipulated and processed data to other components of the system. The central processing unit 22 is a microprocessor commercially available from a variety of manufacturers. Connected to and controlling the operation of the central processing unit 22 is a program memory 24. The program memory 24 is provided for storing various types of data necessary for controlling the operation of the system. The program memory 24 includes a commercially available memory chip that provides for the electronic storage of a large quantity of data in a very small package. The memory chip utilized in the program memory 24 may be either a programable read only memory "PROM" or a read only memory "ROM" specifically designed to control the operation of the system. Data is provided to the central processing unit by entry through a keyboard 26 or through an electronic interface 28 from other data sources as will hereinafter be explained. Data which has been provided to the central processing unit 22 and processed thereby is thereafter stored in a data memory unit 30. The principal component of the data memory unit is a commercially available electronic chip which provides a large data storage capacity in a very small package. Should the amount of data to be processed by the remote hand held unit exceed the capacity of the data memory unit 30, an expansion memory 32 may be provided for the purposes of supplementing the memory capacity. Finally, the data being processed by the central processing unit 22 may be observed on a display unit 34, such as, but not limited to a liquid crystal display of the type which is commercially available.

The electronic interface unit 28 receives data from one or more sources, which is to be provided to the central processing unit, and in turn receives data from the central processing unit for transmission to a radio link microprocessor modulator 36. One source of input to the interface 28 may be a bar code reader, which is connected through a bar code reader interface 38 to the electronic interface 28. To provide for the passing of information through the interface 28 to the central processing unit 22 from a variety of other sources, a standard RS-232 interface is provided. The data which has been passed on to the central processing unit from the bar code reader interface 38 or from the RS-232 interface 40 through the interface 28 is, after processing by the central processing unit 22, retransmitted through the interface 28 to the radio link microprocessor modulator 36. Under the frequency control of a crystal oscillator 42, the data from the central processing unit 22, passed on through the interface 28 to the radio link microprocessor modulator 36, is encoded by modulator 36 and provided to a digital-analog converter 44. The converter 44 in turn provides an analog signal to the radio modulator 46, which generates a RF signal for transmission through antennas, such as shown at 20 in FIG. 6, for ultimate reception by the antenna 18 of the control station 14.

Data may also be transmitted from the control station 14 to the portable remote hand held unit 16. In this case, the RF signal received by the antenna 20 from the radiating antenna 18 is processed by the radio modulator to provide a signal to a received data comparator 48, which in turn provides a digital signal to the radio link microprocessor modulator 36 for decoding, processing, and transmission through the interface 28 to the central processing unit 22.

Before considering in further detail the operation of the portable remote hand held unit 16, reference will be made to FIG. 8, which depicts in a block diagram from the principal components of the control station 14. By comparing FIG. 7 and FIG. 8, it should be readily understood that the principal components of the control station 14 are the same as those of the portable remote hand held unit 16, as shown in FIG. 7. Those components of the control station 14, as shown in FIG. 8, which are essentially the same as those of the portable remote hand held unit 16, shown in FIG. 7, are identified by the same numeral. However, it should be understood, that while electronically the components may perform the same function, they may be and in some cases usually are provided in a different physical form. For instance, the compactness of the unit is more important in the portable remote hand held unit 16, than in the control station 14. Further, it may be desirable to provide a greater number of optional configurations of the components in the control station 14, since it is not subjected to the same size limitations as the hand held unit 16. To provide for such options, a panel of option switches 50 is provided. The user positions the switches to select the desired optional configurations through the central processing unit 22. Another difference between the control station 14 and the hand held unit 16, is that a larger display 52 is provided rather than the small display 34 of the hand held unit. There not being the physical size constraints on the control station 14, the front panel display 52 may utilize various display technologies of the same size or greater size than that of in the hand held unit.

In describing the preferred embodiment of this invention, each encoded character consisted of an odd number of bits, with the binary value always starting with a positive polarity pulse and always ending with a positive polarity pulse with a narrow negative polarity pulse being generated by the pulse generating means for transmission between each of the binary values or unique pulse forms.

In another embodiment of this invention, the pulse generating means includes a means for generating the complement a binary value or unique pulse form, such that a unique pulse form and the complement of a unique pulse form may be alternately transmitted. With an odd number of bits representing each encoded character, the generation of the complement of a unique pulse form makes it unnecessary to generate and provide a narrow negative polarity pulse between each of the unique pulse forms.

While it was found desirable to use two sets of unique nine-bit binary values to provide for the transmission of all 128 standard ASCII characters, it is recognized that in other applications of this invention a different number of bits may be used to encode each character which is to be transmitted. Similarly, while in the preferred embodiment three of the nine pulses are wide, in other applications the number of wide pulses may also be a different number. The benefits of the desirable features of this invention will be realized when all data characters to be transmitted are converted into unique binary values having a preselected total number of bits, of which a predetermined number are logic one bits. Further, each unique multi-bit binary value is formed of the same preselected total number of bits of which the same predetermined number of bits are logic one bits. When an even total number of bits is chosen, each unique pulse form will begin and end with pulses of the opposite polarity, such that the generation of the complement of a unique pulse form or of a narrow pulse between unique pulse forms is not necessary.

Various system parameters, as well as the nature of the data characters to be transmitted, are factors to be considered in determining the total number of bits as well as the number of logic one bits in each unique data character. The choice of the total number of bits and of the number of logic one bits does establish the maximum number of data characters that can be represented by on set of unique multi-bit binary values. If "N" is the total number of bits, and "M" is the number of logic one bits, then the maximum number of data characters which can be represented is "N" factorial divided by the quantity "M" factorial times the quantity "N" minus "M" factorial.

While in accordance with the United States Patent Statutes, a preferred embodiment of the invention has been shown and described, various changes may be made in the encoding and decoding system for electronic data communication system of this invention, without departing from the true spirit and scope of this invention.

The appended claims are intended to cover all such changes and modifications which fall within the true spirit and scope of this invention.

We claim:

1. An electronic data communication system wherein data characteristics are transmitted as analog signals comprising:

converting means for converting each data character into a unique multi-bit binary value consisting of a preselected total number of bits including both logic one bits and logic zero bits, of which bits a predetermined number are logic one bits, each unique multi-bit binary value being formed of the same preselected total number of bits of which the same predetermined number of bits are logic one bits, such that the maximum number of characters which may be converted into unique multi-bit binary values is equal to the total possible number of unique sequences of logic one bits and logic zero bits which may be formed from the preselected total number of bits with the predetermined number of logic one bits;

pulse generating means for generating a unique pulse form which is an analog signal corresponding to each of said unique multi-bit binary values, each of said unique pulse forms consisting of a combination of wide pulses and narrow pulses, said pulse generating means generating a wide pulse for each logic one bit of said unique multi-bit binary value, and generating a narrow pulse for each logic zero bit of said unique multi-bit binary value, said pulses in each of said unique pulse forms having alternating positive and negative values; and means for transmitting said analog signals which represent the data characters.

2. The electronic data communication system of claim 1, wherein said pulse generating means generates wide pulses which have a pulse width ratio with respect to said narrow pulses in the relating magnitude of two to one.

3. The electronic data communication system of claim 1, wherein said preselected total number of bits is an odd number of bits, and each of said unique pulse forms begins and ends with a pulse of the same polarity.

4. The electronic data communication system of claim 3, wherein each of said unique pulse forms begins and ends with a positive polarity pulse.

5. The electronic data communications system of claim 3, wherein a narrow pulse is generated by said pulse generating means, for transmission between each of said unique pulse forms, said narrow pulse being of a polarity opposite that f the beginning and ending pulse of each unique pulse form.

6. The electronic data communication system of claim 5, wherein each of said unique pulse forms begins and ends with a positive polarity pulse, and said narrow pulse transmitted between each of said unique pulse forms is a negative polarity pulse.

7. The electronic data communication system of claim 1, wherein said pulse generating means includes means for generating the complement of a unique pulse form, a unique pulse form and the complement of a unique pulse form being alternately transmitted as analog signals 8. The electronic data communication system of claim 7, wherein said preselected total number of bits is an odd number of bits, such that said unique pulse forms and said complements of a unique pulse form begin with pulses of opposite polarity and end with pulses of the opposite polarity.

9. The electronic data communication system of claim 1, wherein said preselected total number of bits is nine, and each of said unique pulse forms begins and ends with a pulse of the same polarity.

10. The electronic data communication system of claim 9, wherein said predetermined number of logic one bits is three, value wherein said first bit value represents the first character of said three character hexadecimal value.

11. The electronic data communication system of claim 10, including means responsive to one of said unique nine-bit binary values in each of two similar sets of unique nine-bit binary values to shift to the other of said similar sets, such that the number of unique data characters which may be transmitted as analog signals is 166, two less than double the number which may be transmitted when only one set of unique nine-bit binary values is utilized.

12. The electronic data communication system of claim 9, wherein said converting means creates a unique three character hexadecimal value for each data character wherein the first character of said unique three character hexadecimal value is represented by a single logic value, either a logic zero or a logic one.

13. The electronic data communication system of claim 12, wherein said converting means creates a unique nine bit binary value within said first bit value represents the first character of said three character hexadecimal value.

14. The electronic data communication system of claim 13, wherein the second and third characters of the hexadecimal value are each represented by four bit binary values.

15. The electronic data communication system of claim 1, wherein said preselected total number of bits is an even number of bits, and each of said unique pulse forms begin and end with pulses of the opposite polarity.

16. The electronic data communication system of claim 1, wherein said data characters are standard ASCII characters.

17. The electronic data communication system of claim 1, and further comprising means to generate calibration characters which include a predetermined sequence of wide and narrow pulses, and a means to measure said transmitted calibration characters and generate two set points, means responsive to one of said set points for determining an adapted width of positive polarity pulses and to the other of said set points for determining an adapted width of negative polarity pulses, whereby the system adapts to the unique widths of both narrow and wide pulses to compensated for communication system distortion including transmitter, media and receiver distortion.

18. The electronic data communication system of claim 1, and further comprising means to generate a block character check, composed of wide and narrow pulses representing a first checksum, which is derived from and is representative of all the data characters transmitted, and means to generate another block character check composed of wide and narrow pulses representing a second checksum which is derived from and is representative of all the data characters received, and means for comparing said first and second checksum so as to determine the integrity of the data transmission.

19. The electronic data communications system of claim 1, wherein in each unique pulse form the total number of wide pulse generated by said pulse generating means is less than the total number of narrow pulses generated by said pulse generating means.

20. An electronic communication system for converting an analog signal comprised of unique pulse forms each consisting of the same preselected total number of pulses including both wide pulses and narrow pulses, of which the same predetermined number are wide pulses, into data characters comprising:
   means for converting said pulse forms into a unique multi-bit binary value, each of which unique multi-bit binary values consists of the same preselected total number of bits including both logic one bits and logic zero bits, of which bits the same predetermined number are logic one bits; and
   means for converting each of said unique multi-bit binary values into a unique data character.

21. An electronic data communication system wherein data characters are transmitted as analog signals comprising:
   converting means for converting each data character into a unique multi-bit binary value consisting of a preselected total number of bits including both logic one bits and logic zero bits, with there being a predetermined ratio of the number of logic one bits to the number of logic zero bits, each unique multi-bit binary value being formed of the same preselected total number of bits with the same predetermined ratio of logic one bits to logic zero bits, such that the maximum number of data characters which may be converted into unique multi-bit binary values is equal to the total possible number of unique sequences of logic one bits and logic zero bits which may be formed from the preselected total number of bits with the predetermined ratio of logic one bits to logic zero bits;
   pulse generating means for generating a unique pulse form which is an analog signal corresponding to each of said unique multi-bit binary values, each of said unique pulse forms consisting of a combination of wide pulses and narrow pulses, said pulse generating means generating a wide pulse for each logic one bit of said unique multi-bit binary value, and generating a narrow pulse for each logic zero bit of said unique pulse forms having alternating positive and negative values; and means for transmitting said analog signals which represent the data characters.

22. The electronic data communication system of claim 21, wherein said pulse generating means generates wide pulses which have a pulse width ratio with respect to said narrow pulses of in the relative magnitude two to one.

23. The electronic data communication system of claim 21, wherein said preselected total number of bits is an odd number of bits, and each of said unique pulse forms begins and ends with a pulse of the same polarity.

24. The electronic data communication system of claim 23, wherein each of said unique pulse forms begins and ends with a positive polarity pulse.

25. The electronic data communications system of claim 23, wherein a narrow pulse is generated by said pulse generating means, for transmission between each of said unique pulse forms, said narrow pulse being of a polarity opposite that of the beginning and ending pulse of each unique pulse form.

26. The electronic data communication system of claim 25, wherein each of said unique pulse forms begins and ends with a positive polarity pulse, and said narrow pulse transmitted between each of said unique pulse forms is a negative polarity pulse.

27. The electronic data communication system of claim 21, wherein said pulse generating means includes means for generating the complement of a unique pulse form, a unique pulse form and the complement of a unique pulse form being alternately transmitted as analog signals.

28. The electronic data communication system of claim 27, wherein said preselected total number of bits is an odd number of bits, such that said unique pulse forms and said complements of a unique pulse form begin with pulses of opposite polarity and end with pulses of the opposite polarity.

29. The electronic data communication system of claim 21, wherein said preselected total number of bits is nine, and each of said unique pulse forms begins and ends with a pulse of the same polarity.

30. The electronic data communication system of claim 29, wherein said predetermined number of logic one bits is three, such that a total of 84 unique nine-bit binary values are available to represent data characters.

31. The electronic data communication system of claim 30, including means responsive to one of said unique nine-bit binary values in each of two similar sets of unique nine-bit binary values to shift to the other of said similar sets, such that the number of unique data characters which may be transmitted as analog signals is 166, two less than double the number which may be transmitted when only one set of unique nine-bit binary values is utilized.

32. The electronic data communication system of claim 29, wherein said converting means creates a unique three character hexadecimal value for each data character wherein th first character of said unique three character hexadecimal value is represented by a single logic value, either a logic zero or a logic one.

33. The electronic data communication system of claim 32, wherein said converting means creates a unique nine bit binary value wherein said first bit value represents the first character of said three character hexadecimal value.

34. The electronic data communication system of claim 33, wherein the second and third characters of the hexadecimal value are each represented by four bit binary values.

35. The electronic data communication system of claim 21, wherein said preselected total number of bits is an even number of bits, and each of said unique pulse forms begin and end with pulses of the opposite polarity.

36. The electronic data communication system of claim 21, wherein said data characters are standard ASCII characters.

37. The electronic data communications system of claim 21, wherein in each unique pulse form the total number of wide pulses generated by said pulse generating means is less than the total number of narrow pulses generated by said pulse generating means.

38. An electronic data communication system wherein data characters are transmitted as analog signals comprising:

converting means for converting each data character into a unique multi-bit binary value consisting of "n" bits including both logic one bits and logic zero bits, "m" bits of said "n" bits being logic one bits, such that the maximum number of data characters which may be converted into unique multi-bit binary values is equal to the total possible number of unique sequences of logic one bits and logic zero bits which may be formed from the "n" bits of which "m" bits are logic one bits, which maximum number is (n!/M! (n−M)!);

pulse generating means for generating a unique pulse form which is an analog signal corresponding to each of said unique multi-bit binary values, each of said unique pulse forms consisting of a combination of wide pulses and narrow pulses, said pulse generating means generating a wide pulse for each logic one bit of said unique multi-bit binary value, and generating a narrow pulse for each logic zero bit of said unique multi-bit binary value, said pulses in each of said unique pulse forms having alternating positive and negative values; and means for transmitting said analog signals which represent the data characters.

39. The electronic data communications system of claim 38, wherein in each unique pulse form the total number of wide pulses generated by said pulse generating means is less than the total number of narrow pulses generated by said pulse generating means.

* * * * *

UNITED STATES PATENT AND TRADEMARK OFFICE
CERTIFICATE OF CORRECTION

PATENT NO. : 4,817,115

DATED : March 28, 1989

INVENTOR(S) : James A. Campo et al.

It is certified that error appears in the above-identified patent and that said Letters Patent is hereby corrected as shown below:

IN THE SPECIFICATION:

Column 2, line 1, after the word "Diagnostics" insert a (.); move the word "Under" to the left margin;

line 38, delete the word "represents" and substitute therefor--represent--; and line 65, after the word "of" insert the word--the--.

Column 5, line 55, delete the word "th" and substitute therefor--the--.

Column 7, line 59, delete the word "a" and substitute therefor--an--;

after the word "communication" insert the word--link--; and line 59-60, delete the word "antenna" and substitute therefor--antennas--.

UNITED STATES PATENT AND TRADEMARK OFFICE
CERTIFICATE OF CORRECTION

PATENT NO. : 4,817,115

DATED : March 28, 1989

INVENTOR(S) : James A. Campo et al.

It is certified that error appears in the above—identified patent and that said Letters Patent is hereby corrected as shown below:

IN THE SPECIFICATION (cont'd):

Column 8, line 60, delete the word "a" and substitute therefor--an--.

Column 9, line 47, after the word "complement" insert the word--of--.

Column 10, line 14, delete the word "on" and substitute therefor--one--.

IN THE CLAIMS:

Column 10, line 33, delete the word "characteristics" and substitute therefor--characters--.

Column 11, line 12, delete the word "f" and substitute therefor--of--;

UNITED STATES PATENT AND TRADEMARK OFFICE
CERTIFICATE OF CORRECTION

PATENT NO. : 4,817,115
DATED : March 28, 1989
INVENTOR(S) : James A. Campo et al.

It is certified that error appears in the above-identified patent and that said Letters Patent is hereby corrected as shown below:

IN THE CLAIMS (cont'd):

Column 11, line 37-39, delete the words "value wherein said first bit value represents the first character of said three character hexadecimal value." and substitute therefor--such that a total of 84 unique nine-bit binary values are available to represent data characters.--;

line 57, delete the word "within" and substitute therefor--wherein--; and line 67, delete the words "begin and end" and substitute therefor--begins and ends--.

Column 12, line 14, delete the word "compensated" and substitute therefor--compensate--; and line 30, delete the word "pulse" and substitute therefor--pulses--.

UNITED STATES PATENT AND TRADEMARK OFFICE
CERTIFICATE OF CORRECTION

PATENT NO. : 4,817,115

DATED : March 28, 1989

INVENTOR(S) : James A. Campo et al.

It is certified that error appears in the above-identified patent and that said Letters Patent is hereby corrected as shown below:

IN THE CLAIMS (cont'd):

Column 14, line 4, delete the word "th" and substitute therefor --the--.

Signed and Sealed this

Twenty-ninth Day of May, 1990

Attest:

HARRY F. MANBECK, JR.

Attesting Officer      Commissioner of Patents and Trademarks